(12) United States Patent
Seino et al.

(10) Patent No.: US 8,808,557 B1
(45) Date of Patent: Aug. 19, 2014

(54) PATTERN FORMING METHOD

(71) Applicant: Kabushiki Kaisha Toshiba, Tokyo (JP)

(72) Inventors: Yuriko Seino, Tokyo (JP); Hiroki Yonemitsu, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/951,861

(22) Filed: Jul. 26, 2013

(30) Foreign Application Priority Data

Feb. 19, 2013 (JP) ................... 2013-030319

(51) Int. Cl.
*B44C 1/22* (2006.01)
(52) U.S. Cl.
USPC ............. 216/41; 216/43; 216/46; 216/59; 216/66
(58) Field of Classification Search
CPC ........... B81C 1/00031; B81C 1/00396; B81C 1/00404; B81C 2201/0132; G03F 7/004
USPC ............... 216/41, 43, 46, 49, 59, 66
See application file for complete search history.

(56) References Cited

U.S. PATENT DOCUMENTS

| | | | |
|---|---|---|---|
| 5,436,097 A | 7/1995 | Norishima et al. | |
| 8,114,301 B2 | 2/2012 | Millward et al. | |
| 8,114,306 B2 | 2/2012 | Cheng et al. | |
| 2007/0289943 A1* | 12/2007 | Lu et al. | 216/41 |
| 2010/0297847 A1* | 11/2010 | Cheng et al. | 438/694 |
| 2011/0086313 A1 | 4/2011 | Oori et al. | |
| 2013/0126473 A1* | 5/2013 | Dobisz et al. | 216/49 |
| 2013/0209755 A1* | 8/2013 | Hustad et al. | 428/195.1 |
| 2013/0288482 A1* | 10/2013 | Nam et al. | 438/703 |
| 2014/0038318 A1* | 2/2014 | Sato | 438/14 |

FOREIGN PATENT DOCUMENTS

| | | |
|---|---|---|
| JP | 2011-77475 | 4/2011 |
| JP | 2012-64878 | 3/2012 |

* cited by examiner

*Primary Examiner* — Binh X Tran
(74) *Attorney, Agent, or Firm* — Finnegan, Henderson, Farabow, Garrett & Dunner, L.L.P.

(57) ABSTRACT

In one embodiment, a pattern forming method includes forming a physical guide that includes a first pattern in a first region and a second pattern in a second region on an underlying film, embedding a polymer material into a concave portion of the physical guide, microphase-separating the polymer material, to form a self-assembly pattern having a first and a second polymer sections, observing the self-assembly pattern in the second region, to determine from an observation result whether or not the self-assembly pattern in the first region has a predetermined shape, and selectively removing the first polymer section in the case of determining that the self-assembly pattern in the first region has the predetermined shape. The second pattern includes a pattern with a larger coverage ratio than the first pattern and a pattern with a smaller coverage ratio than the first pattern.

15 Claims, 4 Drawing Sheets

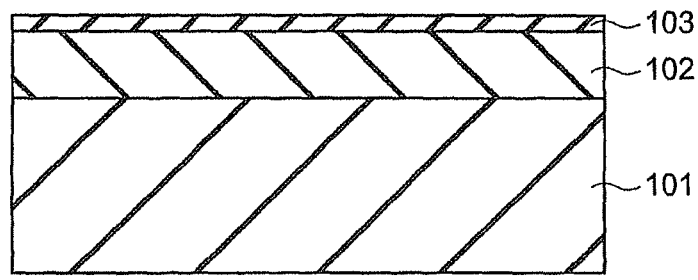
F I G. 1
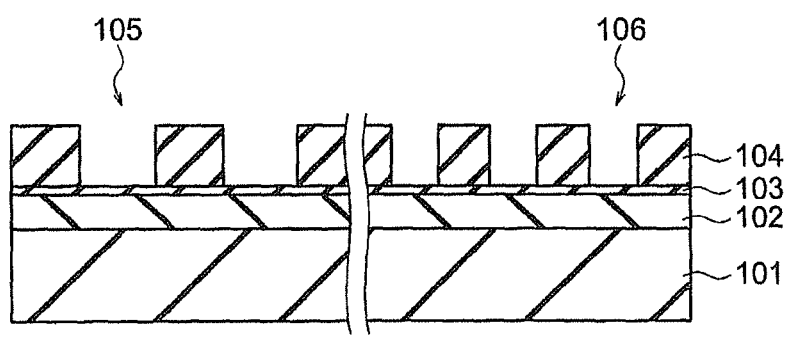
F I G. 2
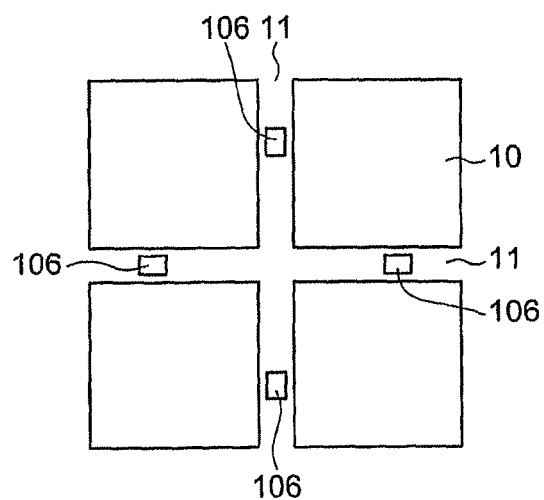
F I G. 3

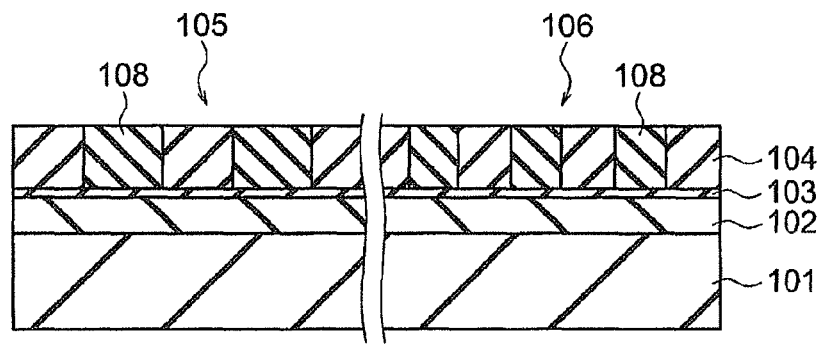
F I G. 4
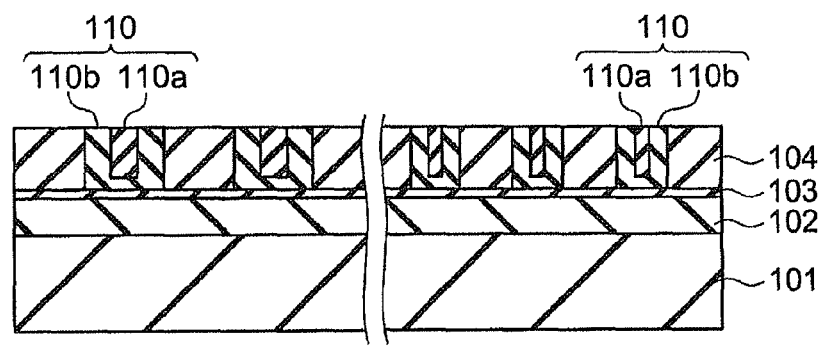
F I G. 5
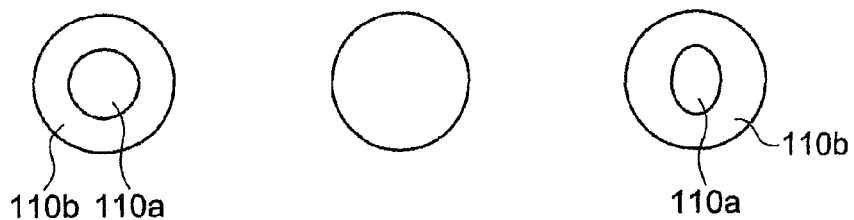
F I G. 6A    F I G. 6B    F I G. 6C

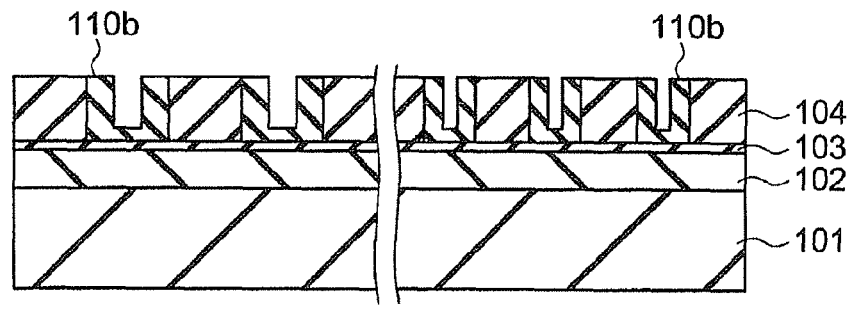
F I G. 7
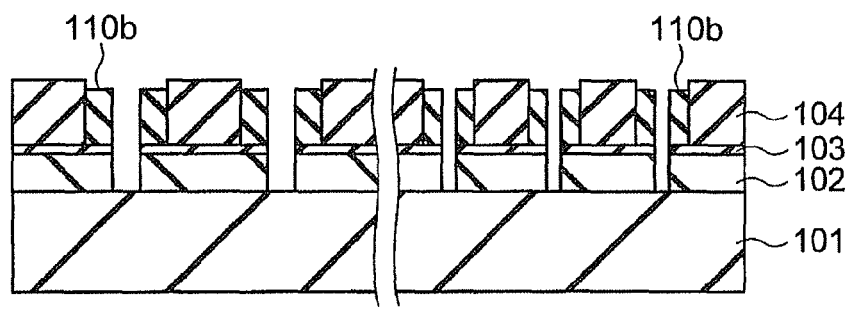
F I G. 8
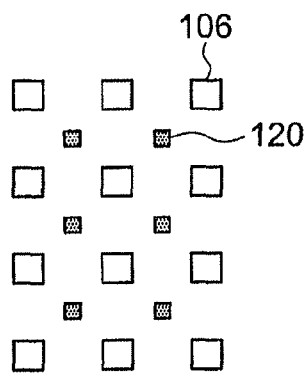 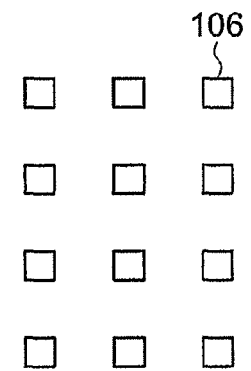
F I G. 9A           F I G. 9B

PATTERN FORMING METHOD

CROSS REFERENCE TO RELATED APPLICATION

This application is based upon and claims benefit of priority from the Japanese Patent Application No. 2013-30319, filed on Feb. 19, 2013, the entire contents of which are incorporated herein by reference.

FIELD

Embodiments described herein relate generally to a pattern forming method.

BACKGROUND

As lithography techniques in a semiconductor element manufacturing process, a double patterning technique by means of ArF-immersion exposure, EUV lithography, nanoimprinting, and the like are known. The conventional lithography techniques have hold a variety of problems, such as cost increase and through-put deterioration in association with increased fineness of a pattern.

Under these circumstances, self-assembly (DSA: Directed Self-Assembly) has been expected to be applied to the lithography technique. Since the self-assembly occurs due to a voluntary behavior of energy stabilization, a pattern with high dimensional accuracy can be formed. In particular, a technique of applying microphase separation of a block copolymer enables formation of periodic structures in a variety of shapes of several nm to several hundred nm by simple coating and anneal processes. By transforming the block copolymer into a spherical shape, a cylindrical shape, a lamellar shape or the like in accordance with a composition ratio of its block, and changing the size of the copolymer in accordance with its molecular weight, it is possible to form a dot pattern, a hole or a pillar pattern, a line pattern, or the like, having a variety of dimensions.

In order to form a desired pattern in a broad range by means of DSA, it is of necessity to provide a guide for controlling a generation position of a polymer phase formed by self-assembly. As the guide known are: a physical guide (grapho-epitaxy) which has a concavo-convex structure and forms a microphase-separation pattern in its concave portion; and a chemical guide (chemical-epitaxy) which is formed in an underlayer of the DSA material and controls, based on a difference in its surface free energy, a formation position of the microphase separation pattern.

For example, a resist film is formed on a film to be processed, and a concave portion is formed in this resist film by photolithography, to obtain the physical guide with the concavo-convex structure. Then, a block copolymer is embedded into the concave portion of the physical guide, followed by heating. This leads to microphase separation of the block copolymer into a first polymer section formed along a side wall of the concave portion and a second polymer section formed in a central portion of the concave portion. Subsequently, the second polymer section is selectively removed, to obtain a fine hole pattern. Then, the film to be processed is processed using the resist film and the first polymer section as masks.

When the block copolymer overflows from the concave portion of the physical guide, a desired phase separation pattern is not obtained. When an amount of the block copolymer inside the concave portion of the physical guide is small, the desired phase separation pattern is not obtained or sufficient processing resistance is not obtained. Hence it has been required to apply the block copolymer such that the top surface of the block copolymer that is embedded into the concave portion of the physical guide is flush with the top surface of the physical guide (resist film).

As for an actual wafer, it is inspected whether or not the block copolymer has been appropriately embedded since fluctuations may occur in dimensions, film thickness, or shape of the physical guide due to variations in material, process, or apparatus inside a wafer, inside a wafer lot, or among wafer lots. For example, an end portion and a central portion of a circuit pattern are observed, to inspect whether an NG region exists in which the block copolymer has not been appropriately embedded.

However, since the pitch and the size of the circuit pattern are fixed, the detection sensitivity for the NG region is low, and this has made the NG-region inspection troublesome. Moreover, even in the case of the NG region being detected, it has not been possible to estimate a correction amount of the application condition.

BRIEF DESCRIPTION OF THE DRAWINGS

FIG. 1 is a process sectional view explaining a pattern forming method according to a present embodiment;

FIG. 2 is a process sectional view following FIG. 1;

FIG. 3 is a view illustrating a dicing line region;

FIG. 4 is a process sectional view following FIG. 2;

FIG. 5 is a process sectional view following FIG. 4;

FIGS. 6A to 6C are views illustrating an example of a shape of a self-assembly pattern;

FIG. 7 is a process sectional view following FIG. 5;

FIG. 8 is a process sectional view following FIG. 7;

FIGS. 9A and 9B are views illustrating an example of a dummy pattern; and

DETAILED DESCRIPTION

Figure 10A:
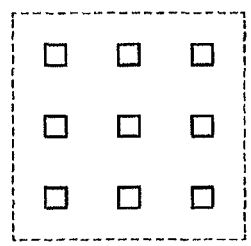
FIG. 10A to 10D are views illustrating an arrangement example of a monitor pattern.

According to one embodiment, a pattern forming method includes forming a physical guide that includes a first pattern in a first region and a second pattern in a second region on an underlying film, applying a polymer material onto the physical guide, to embed the polymer material into a concave portion of the physical guide, microphase-separating the polymer material, to form a self-assembly pattern having a first polymer section and a second polymer section, observing the self-assembly pattern in the second region, to determine from an observation result whether or not the self-assembly pattern in the first region has a predetermined shape, selectively removing the first polymer section in the case of determining that the self-assembly pattern in the first region has the predetermined shape, and processing the underlying film using the physical guide and the second polymer section as a mask. The second pattern includes a pattern with a larger coverage ratio than the first pattern and a pattern with a smaller coverage ratio than the first pattern.

Embodiments will now be explained with reference to the accompanying drawings.

FIGS. 1 to 8 are views explaining a pattern forming method according to a present embodiment.

First, as illustrated in FIG. 1, a hard mask 102 and a reflection preventive film 103 are sequentially formed on a film 101 to be processed. The film 101 to be processed is an oxide film having a film thickness of 300 nm, for example. The hard mask 102 is a carbon film having a film thickness of 100 nm and formed by means of CVD (chemical-vapor deposition), for example. Moreover, the reflection preventive film 103 is an oxide film having a film thickness of 15 nm and formed by means of CVD, for example.

Next, as illustrated in FIG. 2, a resist film 104 having a film thickness of 120 nm is applied by spin-coating onto the reflection preventive film 103, which is then exposed to light with an exposure amount of 20 mJ/cm$^2$ by an ArF-immersion excimer laser and developed, to form a circuit pattern 105 and a monitor pattern 106 in the resist film 104. The circuit pattern 105 and the monitor pattern 106 have a function to serve as a physical guide layer at the time of microphase separation of a block polymer that will be formed in a subsequent process.

For example, the circuit pattern 105 is a hole pattern with a diameter of 70 nm, which is formed with a pitch of 300 nm.

Further, the monitor pattern 106 includes a hole pattern having a plurality of kinds of diameters and/or pitches. The monitor pattern 106 includes a pattern with a larger diameter and a pattern with a smaller diameter than the circuit pattern 105, and a pattern with a larger pitch and a pattern with a smaller pitch than the circuit pattern 105. For example, the monitor pattern 106 includes hole patterns with diameters of 60 nm, 65 nm, 70 nm, 75 nm, and 80 nm. Further, the monitor pattern 106 includes patterns formed with pitches of 150 nm, 250 nm, 300 nm, 350 nm, and 500 nm. In this case, the monitor pattern 106 includes 25 kinds of patterns with the different diameters and/or pitches, as in Table 1.

TABLE 1

Type of monitor pattern

|  | Diameter (nm) | Pitch (nm) |
| --- | --- | --- |
| #1 | 60 | 150 |
| #2 | 60 | 250 |
| #3 | 60 | 300 |
| #4 | 60 | 350 |
| #5 | 60 | 500 |
| #6 | 65 | 150 |
| #7 | 65 | 250 |
| #8 | 65 | 300 |
| #9 | 65 | 350 |
| #10 | 65 | 500 |
| #11 | 70 | 150 |
| #12 | 70 | 250 |
| #13 | 70 | 300 |
| #14 | 70 | 350 |
| #15 | 70 | 500 |
| #16 | 75 | 150 |
| #17 | 75 | 250 |
| #18 | 75 | 300 |
| #19 | 75 | 350 |
| #20 | 75 | 500 |
| #21 | 80 | 150 |
| #22 | 80 | 250 |
| #23 | 80 | 300 |
| #24 | 80 | 350 |
| #25 | 80 | 500 |

As illustrated in FIG. 3, it is preferable to form the monitor pattern 106 in a dicing line region 11 between circuit regions 10 where the circuit patterns 105 are formed.

Next, as illustrated in FIG. 4, the block copolymer (polymer material) 108 is applied onto the resist film 104. For example, a block copolymer (PS-b-PMMA) of polyethylene (PS) and polymethyl methacrylate (PMMA), with a number average molecular weight (Mn) of PS block/PMMA block being 47000/24000, is prepared and a solution of polyethylene glycol monomethyl ether acetate (PGMEA) containing the copolymer with a concentration of 1.0 wt % is applied by spin-coating onto the resist film 104 with the number of revolutions of 2000 rpm. Accordingly, the block copolymer 108 is embedded into the circuit pattern 105 and the monitor pattern 106.

Next, as illustrated in FIG. 5, the laminated body is placed on a hot plate and heated at 110° C. for 90 seconds, and further heated at 220° C. for 3 minutes in a nitrogen atmosphere. Accordingly, the block copolymer 108 is microphase-separated, to form a self-assembly pattern 110 which includes a first polymer section 110a including a first segment and a second polymer section 110b including a second segment.

For example, when the block copolymer 108 is appropriately embedded in the concave portions (the circuit pattern 105 and the monitor pattern 106) of the physical guide in the process illustrated in FIG. 4, the self-assembly pattern 110 includes the first polymer section 110a containing PMMA and having its top surface with a true circular shape and the second polymer section 110b containing PS and surrounding the side surface (and the bottom surface) of the first polymer section 110a, as illustrated in FIG. 6A.

On the other hand, when the revolution speed of the block copolymer 108 at the time of application is low to cause excessive application of the block copolymer 108 and overflowing of the block copolymer 108 from the concave portion of the physical guide, the phase separation does not occur, and hence the self-assembly pattern is not obtained as illustrated in FIG. 6B.

Moreover, when the revolution speed of the block copolymer 108 at the time of application is high to cause insufficient application of the block copolymer 108 and a small thickness of the block copolymer 108 inside the concave portion of the physical guide, desired phase separation does not occur, and hence the top surface of the first polymer section 110a has a shape except the true circular shape, such as an elliptical shape, as shown in FIG. 6C.

In the present embodiment, after the microphase separation process illustrated in FIG. 5, the shape of the self-assembly pattern in the monitor pattern 106 is observed with CD-SEM or a scatterometry, to determine whether or not the desired phase separation has occurred in the circuit pattern 105.

For example, the monitor pattern 106 is observed which has the same size as the circuit pattern 105 and a different pitch from the pitch of the circuit pattern 105. When the circuit pattern 105 is a hole pattern having a diameter of 70 nm and formed with a pitch of 300 nm, the monitor pattern 106 having a diameter of 70 nm and pitches of 150 nm, 250 nm, 300 nm, 350 nm, and 500 nm is observed.

An example of the observation result is indicated in Table 2 below. In Table 2, "Not phase-separated" indicates that the block copolymer 108 was excessively applied and the phase separation did not occur.

"True circle" indicates that the block copolymer 108 was appropriately embedded and the first polymer section 110a with its top surface having a true circular shape as illustrated in FIG. 6(a) was formed.

"Ellipse" indicates that the block copolymer 108 was not sufficiently applied and the first polymer section 110a with its top surface having an elliptical shape as illustrated in FIG. 6(c) was formed.

TABLE 2

| | Pitch of monitor pattern | | | | |
|---|---|---|---|---|---|
| | 150 nm | 250 nm | 300 nm | 350 nm | 500 nm |
| Example 1 | o True circle | o True circle | o True circle | o True circle | x Not phase-separated |
| Example 2 | o True circle | o True circle | o True circle | x Not phase-separated | x Not phase-separated |
| Example 3 | o True circle | o True circle | x Not phase-separated | x Not phase-separated | x Not phase-separated |
| Example 4 | x Ellipse | o True circle | o True circle | o True circle | o True circle |
| Example 5 | x Ellipse | x Ellipse | o True circle | o True circle | o True circle |
| Example 6 | x Ellipse | x Ellipse | x Ellipse | o True circle | o True circle |

In "Example 1", although the phase separation has not occurred in the monitor pattern with a pitch of 500 nm, the true circular shape has been obtained in the monitor pattern with a pitch of 350 nm, which is a rougher pattern than the circuit pattern 105. The block copolymer is more apt to be embedded into (overflow from) the monitor pattern with a pitch of 350 nm than the circuit pattern 105 with a pitch of 300 nm. For this reason, when the true circular shape has been obtained in the monitor pattern with a pitch of 350 nm, it is thought that the true circular shape has been obtained in (almost) the entire circuit pattern 105. For this reason, when such an observation result as that of "Example 1" is obtained, it is determined that the desired phase separation has occurred in the circuit pattern 105.

In "Example 2", although the true circular shape has been obtained in the monitor pattern with a pitch of 300 nm, the phase separation has not occurred in the monitor pattern with a pitch of 350 nm. In this case, the true circular shape is not likely to be obtained in (almost) the entire circuit pattern 105. For this reason, when such an observation result as that of "Example 2" is obtained, it is determined that the desired phase separation has not occurred in the circuit pattern 105.

In "Example 3", the phase separation has not occurred in the monitor pattern with a pitch of 300 nm. In this case, it is thought that the phase separation has not occurred also in the circuit pattern 105. For this reason, when such an observation result as that of "Example 3" is obtained, it is determined that the desired phase separation has not occurred in the circuit pattern 105.

In "Example 4", although the top surface of the first polymer section 110a has an elliptical shape in the monitor pattern with a pitch of 150 nm, the true circular shape has been obtained in the monitor pattern with a pitch of 250 nm, which is a denser pattern than the circuit pattern 105. The block copolymer is less apt to be embedded into and has a smaller film thickness in the monitor pattern with a pitch of 250 nm than the circuit pattern 105 with a pitch of 300 nm. For this reason, when the true circular shape has been obtained in the monitor pattern with a pitch of 250 nm, it is thought that the true circular shape has been obtained in (almost) the entire circuit pattern 105. For this reason, when such an observation result as that of "Example 4" is obtained, it is determined that the desired phase separation has occurred in the circuit pattern 105.

In "Example 5", although the true circular shape has been obtained in the monitor pattern with a pitch of 300 nm, the top surface of the first polymer section 110a has an elliptical shape in the monitor pattern with a pitch of 250 nm. In this case, the true circular shape is not likely to be obtained in (almost) the entire circuit pattern 105. For this reason, when such an observation result as that of "Example 5" is obtained, it is determined that the desired phase separation has not occurred in the circuit pattern 105.

In "Example 6", the top surface of the first polymer section 110a has an elliptical shape in the monitor pattern with a pitch of 300 nm. In this case, it is thought that the top surface of the first polymer section 110a has an elliptical shape also in the circuit pattern 105. For this reason, when such an observation result as that of "Example 6" is obtained, it is determined that the desired phase separation has not occurred in the circuit pattern 105.

Next described will be a case where the monitor pattern 106 having the same pitch as the circuit pattern 105 and a different size therefrom is observed. When the circuit pattern 105 is a hole pattern having a diameter of 70 nm and formed with a pitch of 300 nm, the monitor pattern 106 having a pitches of 300 nm and diameters of 60 nm, 65 nm, 70 nm, 75 nm and 80 nm is observed.

An example of the observation result is indicated in Table 3 below. In Table 3, "Not phase-separated" indicates that the block copolymer 108 was excessively applied and the phase separation did not occur.

"True circle" indicates that the block copolymer 108 was appropriately embedded and the first polymer section 110a with its top surface having a true circular shape as illustrated in FIG. 6(a) was formed.

"Ellipse" indicates that the block copolymer 108 was not sufficiently applied and the first polymer section 110a with its top surface having an elliptical shape as illustrated in 6C was formed.

TABLE 3

| | Size of monitor pattern | | | | |
|---|---|---|---|---|---|
| | 60 nm | 65 nm | 70 nm | 75 nm | 80 nm |
| Example 7 | x Not phase-separated | o True circle | o True circle | o True circle | o True circle |
| Example 8 | x Not phase-separated | x Not phase-separated | o True circle | o True circle | o True circle |
| Example 9 | x Not phase-separated | x Not phase-separated | x Not phase-separated | o True circle | o True circle |
| Example 10 | o True circle | o True circle | o True circle | o True circle | x Ellipse |
| Example 11 | o True circle | o True circle | o True circle | x Ellipse | x Ellipse |
| Example 12 | o True circle | o True circle | x Ellipse | x Ellipse | x Ellipse |

In "Example 7", although the phase separation has not occurred in the monitor pattern with a diameter of 60 nm, the true circular shape has been obtained in the monitor pattern with a diameter of 65 nm, which is a rougher pattern than the circuit pattern 105. The block copolymer is more apt to be embedded into (overflow from) the monitor pattern with a diameter of 65 nm than the circuit pattern 105 with a diameter of 70 nm. For this reason, when the true circular shape has been obtained in the monitor pattern with a diameter of 65 nm, it is thought that the true circular shape has been obtained in (almost) the entire circuit pattern 105. For this reason, when such an observation result as that of "Example 7" is obtained, it is determined that the desired phase separation has occurred in the circuit pattern 105.

In "Example 8", although the true circular shape has been obtained in the monitor pattern with a diameter of 70 nm, the phase separation has not occurred in the monitor pattern with diameter of 65 nm. In this case, the true circular shape is not likely to be obtained in (almost) the entire circuit pattern 105. For this reason, when such an observation result as that of "Example 8" is obtained, it is determined that the desired phase separation has not occurred in the circuit pattern 105.

In "Example 9", the phase separation has not occurred in the monitor pattern with a diameter of 70 nm. In this case, it is thought that the phase separation has not occurred also in the circuit pattern 105. For this reason, when such an observation result as that of "Example 9" is obtained, it is determined that the desired phase separation has not occurred in the circuit pattern 105.

In "Example 10", although the top surface of the first polymer section 110a has an elliptical shape in the monitor pattern with a diameter of 80 nm, the true circular shape has been obtained in the monitor pattern with a diameter of 75 nm, which is a denser pattern (with a larger aperture ratio) than the circuit pattern 105. The block copolymer is less apt to be embedded into and has a smaller film thickness in the monitor pattern with a diameter of 75 nm than the circuit pattern 105 with a diameter of 70 nm. For this reason, when the true circular shape has been obtained in the monitor pattern with a diameter of 75 nm, it is thought that the true circular shape has been obtained in (almost) the entire circuit pattern 105. For this reason, when such an observation result as that of "Example 10" is obtained, it is determined that the desired phase separation has occurred in the circuit pattern 105.

In "Example 11", although the true circular shape has been obtained in the monitor pattern with a diameter of 70 nm, the top surface of the first polymer section 110a has an elliptical shape in the monitor pattern with a diameter of 75 nm. In this case, the true circular shape is not likely to be obtained in (almost) the entire circuit pattern 105. For this reason, when such an observation result as that of "Example 11" is obtained, it is determined that the desired phase separation has not occurred in the circuit pattern 105.

In "Example 12", the top surface of the first polymer section 110a has an elliptical shape in the monitor pattern with a diameter of 70 nm. In this case, it is thought that the top surface of the first polymer section 110a has an elliptical shape also in the circuit pattern 105. For this reason, when such an observation result as that of "Example 12" is obtained, it is determined that the desired phase separation has not occurred in the circuit pattern 105.

When such an observation result as those of "Example 2", "Example 3", "Example 5", "Example 6", "Example 8", "Example 9", "Example 11", and "Example 12" described above is obtained and it is determined that the desired phase separation has not occurred in the circuit pattern 105, the polymer material is removed using a thinner or the like, and the application of the block copolymer (FIG. 4) and the microphase separation (FIG. 5) are re-performed. At the time of re-application of the block copolymer, the application condition is corrected. The application condition here is, for example, the number of revolutions.

For example, when such an observation result as those of "Example 2", "Example 3", "Example 8", and "Example 9" is obtained, it is considered that the revolution speed was low, and hence the application condition is corrected so as to increase the number of revolutions. Here, the range of increase in number of revolutions is larger in the case of obtaining such an observation result as those of "Example 3" and "Example 9" than in the case of obtaining such an observation result as those of "Example 2" and "Example 8". Moreover, previously investigating a correction amount of the number of revolutions in the case of obtaining the observation result as those of "Example 2" and "Example 8" and previously investigating a correction amount of the number of revolutions in the case of obtaining the observation result as those of "Example 3" and "Example 9" can facilitate estimating the correction amount.

Furthermore, for example when such an observation result as those of "Example 5", "Example 6", "Example 11", and "Example 12" is obtained, it is considered that the revolution speed was high, and hence the application condition is corrected so as to reduce the number of revolutions. Here, the range of reduction in number of revolutions is larger in the case of obtaining such an observation result as those of "Example 6" and "Example 12" than in the case of obtaining such an observation result as those of "Example 5" and "Example 11". Previously investigating a correction amount of the number of revolutions in the case of obtaining the observation result as those of "Example 6" and "Example 12" and previously investigating a correction amount of the number of revolutions in the case of obtaining the observation result as those of "Example 5" and "Example 11" can facilitate estimating the correction amount.

When such an observation result as those of "Example 1", "Example 4", "Example 7", and "Example 10" described above is obtained and it is determined that the desired phase separation has occurred in the circuit pattern 105, the processing goes to the next step. For example, as illustrated in FIG. 7, the second polymer section 110b is made to remain and the first polymer section 110a is selectively removed by oxide RIE (reactive ion etching), to form a hole pattern.

Subsequently, as illustrated in FIG. 8, the second polymer section 110b having been made to remain and the resist film 104 are used as masks, to process the reflection preventive film 103 and the hard mask 102 by RIE using fluorine gas.

Then, the second polymer section 110b and the resist film 104 are removed, and the film 101 to be processed is processed using the hard mask 102 as a mask.

As thus described, in the present embodiment, the monitor pattern including a pattern with a larger pitch and a pattern with a smaller pitch than the circuit pattern, and/or the monitor pattern including a pattern of a larger size and a pattern of a smaller size than the circuit pattern are formed. That is, the monitor pattern including a pattern with a larger aperture ratio and a pattern with a smaller aperture ratio than the circuit pattern is formed. From an observation result of a phase separation state of the block copolymer in such a monitor pattern, it is possible to inspect in a simplified manner as to whether or not the desired phase separation has occurred in the circuit pattern, namely whether or not the block copolymer has been appropriately applied. Moreover, a correction amount of the application condition can be estimated from the observation result.

Although a plurality of monitor patterns of the changed sizes and the plurality of monitor patterns with the changed pitches have been formed in the above embodiment, a plurality of monitor patterns whose sizes are the same as the circuit pattern but whose pitches have only been changed from the circuit pattern may be formed. Alternatively, a plurality of monitor patterns whose pitches are the same as the circuit pattern but whose sizes have only been changed from the circuit pattern may be formed.

Moreover, the monitor pattern has included the pattern of the same size (or the same pitch) as the circuit pattern, two kinds of patterns of the larger sizes (or the larger pitches) than the circuit pattern, and two kinds of patterns of the smaller sizes (or the smaller pitches) than the circuit pattern in the above embodiment, but the monitor pattern may include three or more kinds of patterns of larger sizes (or larger pitches) than the circuit pattern. Furthermore, the monitor pattern may also include three or more kinds of patterns of smaller sizes (or smaller pitches) than the circuit pattern.

Although the size or the pitch of the monitor pattern has been changed to form a monitor pattern with a different coverage ratio (aperture ratio) in the above embodiment, a fine dummy pattern to serve as a DSA sub-resolution assist feature (SRAF) may be formed to adjust a coverage ratio of the monitor pattern. For example, as illustrated in FIG. 9A, a fine dummy pattern 120 is formed between the monitor patterns 106. The dummy pattern 120 becomes invisible when embedded into the block copolymer, as illustrated in FIG. 9B. As thus described, whether or not the dummy pattern 120 disappears may be observed.

Figure 10B:
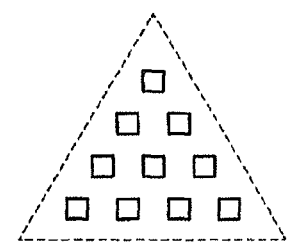

The monitor pattern 106 may be formed such that the outer shape of the monitor pattern arrangement region is a rectangle as illustrated in FIG. 10A, or may be formed such that the outer shape of the monitor pattern arrangement region is a triangle as illustrated in FIG. 10B. Moreover, it may be formed such that the outer shape of the monitor pattern arrangement region is a rhombus as illustrated in FIG. 10C, or may be formed such that the outer shape of the monitor pattern arrangement region is a parallelogram as illustrated in FIG. 10D.

Figure 10C:
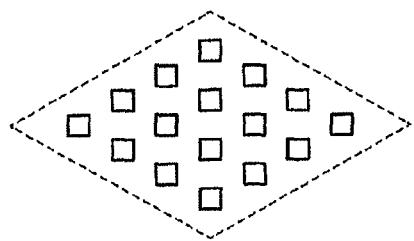
Figure 10D:
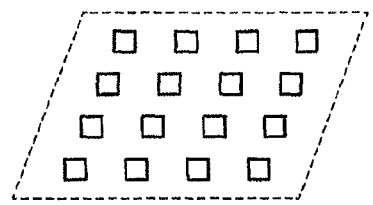

When an area with an acute angle (smaller than 90°) is included in the outer shape of the monitor pattern arrangement region as illustrated in FIGS. 10B to 10D, a region without the pattern spreads widely in the vicinity of the monitor pattern 106a located at the tip of the monitor pattern arrangement region. In such an area, the coverage ratio significantly changes, thereby facilitating detection of an NG area for embedment.

Although the case of the circuit pattern 105 being the hole pattern has been described in the above embodiment, it may be a line pattern. In this case, the monitor pattern 106 is preferably a line pattern with a different pitch or line width.

Moreover, for the block copolymer (polymer material) 108, not only the block copolymer of polystyrene (PS) and polymethyl methacrylate (PMMA) is used, but another material, such as a block copolymer of polystyrene (PS) and polydimethyl siloxane (PDMS), may be used.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A pattern forming method, comprising:
    forming a physical guide that includes a first pattern in a first region and a second pattern in a second region on an underlying film;
    applying a polymer material onto the physical guide, to embed the polymer material into a concave portion of the physical guide;
    microphase-separating the polymer material, to form a self-assembly pattern having a first polymer section and a second polymer section;
    observing the self-assembly pattern in the second region, to determine from an observation result whether or not the self-assembly pattern in the first region has a predetermined shape;
    selectively removing the first polymer section in the case of determining that the self-assembly pattern in the first region has the predetermined shape; and
    processing the underlying film using the physical guide and the second polymer section as a mask,
    wherein the second pattern includes a pattern with a larger coverage ratio than the first pattern and a pattern with a smaller coverage ratio than the first pattern.

2. The pattern forming method according to claim 1, wherein the second pattern includes a pattern with a larger pitch than the first pattern and a pattern with a smaller pitch than the first pattern.

3. The pattern forming method according to claim 1 or 2, wherein the second pattern includes a pattern of a larger size than the first pattern and a pattern of a smaller size than the first pattern.

4. The pattern forming method according to claim 1, wherein
    the first region is a circuit region, and
    the second region is a dicing line region between the circuit regions.

5. The pattern forming method according to claim 1, wherein the outer shape of the arrangement region of the second pattern is a triangle, a rhombus or a parallelogram.

6. The pattern forming method according to claim 1, wherein the second pattern includes a dummy pattern which becomes non-observable by being embedded into the polymer material.

7. The pattern forming method according to claim 1, wherein, when the observation result indicates that the self-assembly pattern in the pattern with a larger coverage ratio than the first pattern and the self-assembly pattern in the pattern with a smaller coverage ratio than the first pattern have a predetermined shape, it is determined that the self-assembly pattern in the first region has the predetermined shape.

8. The pattern forming method according to claim 7, wherein, when the observation result indicates that the self-assembly pattern in the pattern with a larger coverage ratio than the first pattern and the self-assembly pattern in the pattern with a smaller coverage ratio than the first pattern do not have the predetermined shape, it is determined that the self-assembly pattern in the first region does not have the predetermined shape, and the self-assembly pattern is peeled off to reapply the polymer material.

9. The pattern forming method according to claim 8, wherein
    the polymer material is applied by spin-coating, and
    a revolution speed is corrected based on the observation result at the time of reapplying the polymer material.

10. The pattern forming method according to claim 9, wherein the second pattern includes a pattern with a larger pitch than the first pattern and a pattern with a smaller pitch than the first pattern.

11. The pattern forming method according to claim 10, wherein, when phase separation has not occurred in the pattern with a larger pitch than the first pattern and the self-assembly pattern in the pattern with a smaller pitch than the first pattern has the predetermined shape, the revolution speed is corrected upward.

12. The pattern forming method according to claim 10, wherein, when the self-assembly pattern in the pattern with a larger pitch than the first pattern has the predetermined shape and the self-assembly pattern in the pattern with a smaller pitch than the first pattern does not have the predetermined shape, the revolution speed is corrected downward.

13. The pattern forming method according to claim 9, wherein the second pattern includes a pattern of a larger size than the first pattern and a pattern of a smaller size than the first pattern.

14. The pattern forming method according to claim 13, wherein, when phase separation has not occurred in the pattern of a smaller size than the first pattern and the self-assembly pattern in the pattern of a larger size than the first pattern has the predetermined shape, the revolution speed is corrected upward.

15. The pattern forming method according to claim 13, wherein, when the self-assembly pattern in the pattern of a smaller size than the first pattern has the predetermined shape and the self-assembly pattern in the pattern of a larger size than the first pattern does not have the predetermined shape, the revolution speed is corrected downward.

* * * * *